United States Patent [19]

Nakajima et al.

[11] 3,745,385

[45] July 10, 1973

[54] PIEZOELECTRIC CERAMIC RESONATOR

[75] Inventors: Yasuo Nakajima; Takashi Nagata; Kiyokazu Hagiwara; Reiichi Sasaki, all of Osaka, Japan

[73] Assignee: Matsushita Electric Industrial Co., Ltd., Kadoma, Osaka, Japan

[22] Filed: Jan. 31, 1972

[21] Appl. No.: 222,254

[52] U.S. Cl....................... 310/9.5, 310/8.2, 310/9.6
[51] Int. Cl............................................. H04r 17/00
[58] Field of Search...................... 310/8.1, 8.2, 9.5, 310/9.6, 8.5, 9.1; 333/30, 72 R

[56] References Cited

UNITED STATES PATENTS 2,945,984 7/1960 Yando ............................ 310/8.1 X

*Primary Examiner*—J. D. Miller
*Assistant Examiner*—Mark O. Budd
*Attorney*—E. F. Wenderoth, V. M. Creedon et al.

[57] ABSTRACT

A piezoelectric ceramic resonator vibrating resonantly in a thickness-shear vibration mode, which is free from unwanted vibrations in a high frequency range. The piezoelectric ceramic resonator comprises a thin wafer of piezoelectric ceramic material polarized in a direction parallel to the major surfaces thereof. A tetragonal electrode is applied to a part of one of the major surfaces, and a counter electrode is applied to another of the major surfaces, the counter electrode being at least as large as the area of the tetragonal electrode. Two slots are positioned along the opposite edges of the tetragonal electrode. The two slots have walls which are perpendicular to the major surfaces and the slots are at least as long as the opposite sides of the tetragonal electrode. At least one of the two slots has the ends closed by being spaced inwardly from the edges of the wafer.

3 Claims, 4 Drawing Figures

PIEZOELECTRIC CERAMIC RESONATOR

BACKGROUND OF THE INVENTION

1. Field of the Invention

This invention relates to a piezoelectric ceramic resonator which vibrates resonantly in the thickness-shear mode. In particular, it relates to a piezoelectric ceramic resonator which is free from unwanted vibrations and which is especially useful for an electrical wave filter.

2. Description of the Prior Art

A piezoelectric ceramic resonator which vibrates resonantly in a thickness-shear mode has a resonance frequency of thickness-shear vibration at a desired frequency. The resonance frequency of the thickness-shear vibration is inversely proportional to the thickness of the piezoelectric ceramic resonator. Therefore, a piezoelectric ceramic resonator vibrating in a thickness-shear mode is basically applicable in a high frequency range. As a practical matter, such piezoelectric ceramic resonator has a lot of unwanted response due to subresonant vibrations.

Great efforts have been made to eliminate the unwanted vibrations. Reduction of the electrode area on the crystal plate is effective for elimination of unwanted vibrations as described in U. S. Pat. No. 2,249,933 patented July 22, 1941 and U. S. Pat. No. 3,222,622 patented Dec. 7, 1965. According to the prior art, the extent to which unwanted vibrations are eliminated varies subtly with the size of the applied electrodes. Therefore, this prior art solution is not ideal because an extremely high dimensional accuracy of the electrodes is required in order to eliminate unwanted vibrations. Furthermore, flexure vibrations can propagate freely in the piezoelectric plate and remain as unwanted vibrations in the piezoelectric resonator according to the prior art.

SUMMARY OF THE INVENTION

It is a primary object of the invention to provide a piezoelectric ceramic resonator which vibrates resonantly in the thickness-shear mode and which is free from unwanted responses.

Another object of the invention is to provide such a piezoelectric ceramic resonator which requires less dimensional accuracy of the electrodes than prior art resonators and which can be fabricated at a low cost.

A further object of the invention is to provide such a piezoelectric ceramic resonator which has slots in the piezoelectric ceramic wafer which are effective in eliminating unwanted vibrations.

These objects are achieved by providing a piezoelectric ceramic resonator according to the present invention which comprises a thin wafer of piezoelectric ceramic material having two slots therein positioned so as to eliminate unwanted vibrations.

A tetragonal electrode is applied to part of one of the major surfaces of the wafer. A counter electrode is applied to the other of the major surfaces and which electrode is at least as large as the area of the tetragonal electrode. Two slots are positioned along the opposite sides of the tetragonal electrode. The two slots have the walls thereof perpendicular to the major surfaces and are at least as long as the opposite sides of the tetragonal electrode. At least one of the two slots has the ends closed by being spaced inwardly from the edges of the wafer.

BRIEF DESCRIPTION OF THE DRAWINGS

Other objects and advantages will become apparent from the following description taken in connection with the drawing, wherein.

DESCRIPTION OF THE PREFERRED EMBODIMENT

Figure 1:
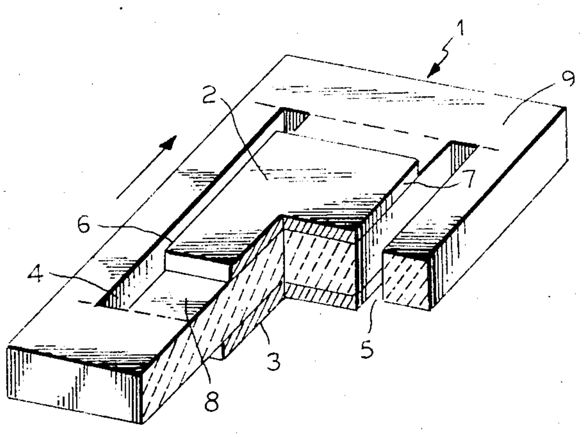
FIG. 1 is a perspective view, partly in section, showing a piezoelectric ceramic resonator according to the present invention.
Figure 2:
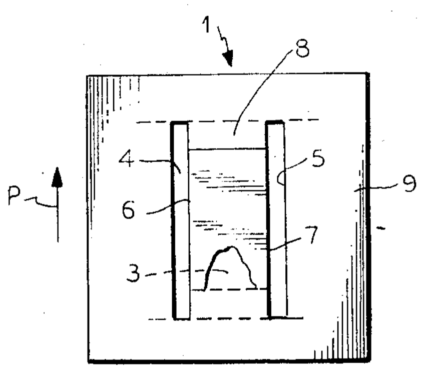
FIG. 2 is a top plan view of the piezoelectric ceramic resonator shown in FIG. 1.

Referring to FIGS. 1 and 2 of the drawings, a piezoelectric ceramic resonator according to the invention is shown which comprises a thin wafer 1 of piezoelectric ceramic material. Wafer 1 is provided with electrodes 2 and 3 on its respective major surfaces. Electrodes 2 and 3 are positioned opposite each other so as to form an electrode pair which coacts with the intervening piezoelectric wafer 1 to form a piezoelectric resonator. Wafer 1 is provided with two slots 4 and 5 to eliminate unwanted vibrations.

In accordance with the present invention, the piezoelectric ceramic resonator is to vibrate resonantly in a thickness-shear mode of vibration. For operation of the piezoelectric ceramic resonator in a thickness-shear mode, wafer 1, or at least the portions thereof disposed between the opposed electrodes 2 and 3, is polarized in a direction parallel to the major surfaces thereof as shown by an arrow line P of FIGS. 1 and 2. The wafer 1 can be made of any piezoelectric ceramic material such as solid solutions of lead titanate and lead zirconate in certain molar ratios and their modifications combined with certain additives. The thickness of the wafer 1 is determined by the desired frequency. The piezoelectric ceramic resonator is designed for high frequency operation, its fundamental operating frequency being higher than 1 megacycle.

Electrodes 2 and 3 may be fabricated by applying electrodes on the entire opposite major surfaces of the wafer 1 and then removing the undesired portions of the electrodes to leave the operating electrodes desired. The preferred shape of the electrodes 2 and 3 is tetragonal so as to eliminate the unwanted vibrations. The electrode 3 on one major surface of the wafer 1 can be replaced by an electrode covering the entire surface or one which is of such shape, dimensions and location as to oppose the electrode 2 on the opposite major surface of the wafer 1.

The present invention accomplishes the elimination of unwanted vibrations by providing the slots 4 and 5 in the wafer 1. The slots 4 and 5 are positioned along the opposite side edges 6 and 7 of the tetragonal electrode 2. The slots 4 and 5 have the walls thereof perpendicular to the major surfaces of the wafer 1 and in the embodiment shown are longer than the opposite side edges 6 and 7 of the tetragonal electrode 2. It is important for effective elimination of unwanted vibrations that the slots 4 and 5 be at least as long as the edges 6 and 7. Furthermore, in the FIGS. 1 and 2, the slots 4 and 5 are not open to the edge of the wafer 1, the ends of the slots being spaced inwardly from the edges of the wafer 1, that is to say, two slots 4 and 5 have the ends closed by being spaced inwardly from the edges of the wafer so as to eliminate unwanted vibrations very efficiently.

Unwanted vibrations are excited at the boundary between the electroded region and the region not covered by an electrode in a partially electroded resonator vibrating in a thickness-shear mode. The slots 4 and 5 provided in accordance with the present invention make the boundary between the electroded region and the region not covered by an electrode unequal. The electroded region has a free boundary condition at the portion facing the slots and has a boundary condition at another portion such that the electroded region has the region of the wafer 1 not covered by an electrode as a mass load. The inequality at the boundary of the electroded region causes unwanted vibrations to dissipate and scatter so that the effect of the unwanted vibrations can be made practically negligible. Therefore, it is an important condition in order to eliminate unwanted vibrations by providing a satisfactory inequality at the boundary of the plated region that the two slots 4 and 5 be positioned along the opposite side edges 6 and 7 of the tetragonal electrode 2 and that they be at least as long as the opposite side edges 6 and 7.

Referring to FIG. 1 and FIG. 2, a central portion and the remainder of the wafer 1 are designated by reference numerals 8 and 9. The central portion 8 is surrounded by the two slots and two straight dashed lines extending between the opposite ends of the slots 4 and 5. The remainder 9 of the wafer 1 holds the central portion 8 and acts as a vibration damper for eliminating unwanted vibrations. The remainder 9 prevents unwanted vibrations such as flexure vibrations from being excited in the central portion 8 by a clamping effect. For vibration damping, it is an important condition that at least one of the slots 4 and 5 not be open to the edges of the wafer 1, i.e., that it have both ends closed. For satisfactory damping, it is required that at least one of the slots have the ends spaced from the edge of the wafer 1 a distance greater than three times the thickness of the wafer 1.

The displacement and propagation of the thickness-shear wave is in a direction parallel to the polarization direction P. Therefore, unwanted vibrations can be effectively eliminated without seriously affecting the thickness-shear vibration by making the side of each of the two slots 4 and 5 along the sides of the tetragonal electrode 2 straight and parallel to the direction of polarization P of the wafer 1. The slots can be formed, for example, by ultrasonic machining.

Figure 3:
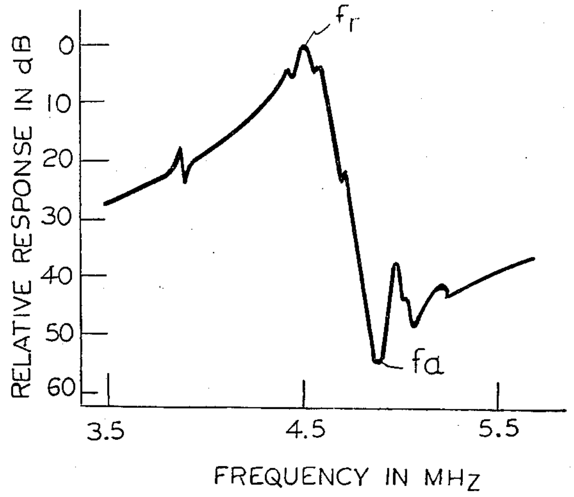
FIG. 3 is a frequency response curve of a resonator having electrodes applied to only a part of the surfaces thereof.

Actual tests show a great improvement in the performance of a piezoelectric ceramic resonator embodying the invention especially with respect to elimination of unwanted vibrations. FIG. 3 of the drawings illustrates graphically the frequency response of a partially electroded resonator. This resonator was prepared according to methods existing before the present invention. A pair of rectangular electrodes was applied to a central portion of the major surfaces of the wafer of the piezoelectric ceramic resonator, the longer opposed sides of the rectangular electrodes being in a direction parallel to the polarization direction. In the FIG. 3, $f_r$ and $f_a$ show the resonance and anti-resonance frequency of the fundamental thickness-shear vibration, respectively. The curve in this case shows unwanted responses in modes relatively close to the fundamental peak response.

Figure 4:
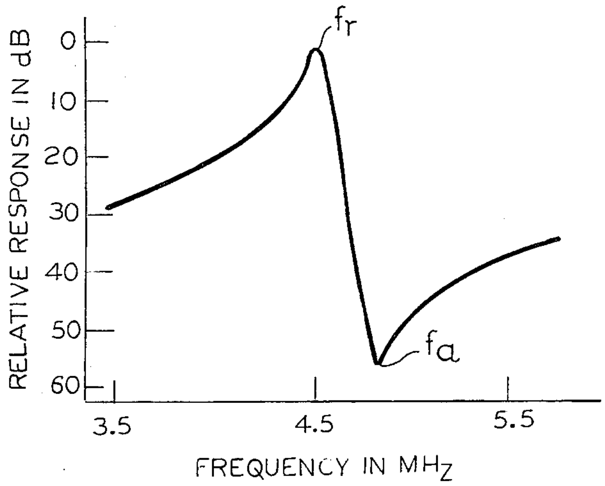
FIG. 4 is a frequency response curve of the piezoelectric ceramic resonator according to the present invention.

FIG. 4 shows the response characteristic of the piezoelectric ceramic resonator according to the present invention. This piezoelectric ceramic resonator was provided with two slots in the same partially electroded resonator as that used in the test of FIG. 3. The two slots were positioned along the longer opposite side edges of the rectangular electrodes and the ends were spaced inwardly from the edges of the wafer a distance equal to five times the thickness of the wafer. The two slots were longer than the longer opposite side edges of the rectangular electrodes. In FIG. 4, $f_r$ and $F_a$ show the resonance and anti-resonance frequency of the fundamental thickness-shear vibration, respectively. The curve of FIG. 4 shows a great improvement in eliminating unwanted responses.

From the description and drawings of the embodiments chosen an exemplary of the preferred application of the principles of both and method and apparatus aspects of the present invention, it will be clear to those skilled in the art that certain minor modifications and variations may be employed without departing from the essence and true spirit of the invention. Accordingly, it is to be understood that the invention should be deemed limited only by the fair scope of the claims that follow and equivalents thereto.

What is claimed is:

1. A piezoelectric ceramic resonator vibrating resonantly in a thickness-shear vibration mode, said resonator comprising: a thin wafer of piezoelectric ceramic material which is polarized in a direction parallel to the major surfaces thereof; electrode means consisting of a tetragonal electrode applied to part of the area of one of said major surfaces, a counter electrode applied to the other of said major surfaces opposed to said tetragonal electrode and having an area at least as large as said tetragonal electrode; and said wafer having two slots therein along the opposite side edges of said tetragonal electrode and which slots have the walls thereof perpendicular to said major surfaces, said slots being at least as long as said opposite side edges, at least one of the two slots having the ends closed by being spaced inwardly from the edges of said wafer.

2. A piezoelectric ceramic resonator as claimed in claim 1, wherein each of said two slots has the side along said tetragonal electrode straight and parallel to said polarization direction.

3. A piezoelectric ceramic resonator as claimed in claim 1 wherein at least one of said two slots has the ends spaced inwardly from the edges of said wafer a distance greater than three times the thickness of said wafer.

* * * * *

65